（12）United States Patent
Lim et al.

(10) Patent No.: US 8,017,434 B2
(45) Date of Patent: Sep. 13, 2011

(54) SEMICONDUCTOR CHIP PACKAGE FIXTURE

(75) Inventors: Kevin W. Lim, Sunnyvale, CA (US); Seah S. Too, San Jose, CA (US); Azlina N. Nayan, Kedah (ML); Kee Hean Keok, Pulau Penang (ML); Soon Tatt Ow Yong, Penang (ML)

(73) Assignee: Advanced Micro Devices, Inc., Sunnyvale, CA (US)

( * ) Notice: Subject to any disclaimer, the term of this patent is extended or adjusted under 35 U.S.C. 154(b) by 474 days.

(21) Appl. No.: 12/277,060

(22) Filed: Nov. 24, 2008

(65) Prior Publication Data

US 2010/0129959 A1   May 27, 2010

(51) Int. Cl.
*H01L 21/00* (2006.01)

(52) U.S. Cl. . 438/106; 438/121; 257/699; 257/E23.001; 257/E23.041

(58) Field of Classification Search ............ 438/106, 438/107, 109, 111, 121, 123; 257/672, 676, 257/678, 685, 686, 697, 699, 708, 795, E23.024, E23.041, E23.043
See application file for complete search history.

(56) References Cited

U.S. PATENT DOCUMENTS 6,759,754 B1 * 7/2004 Nishizawa et al. ............ 257/797
7,309,916 B2 * 12/2007 Kang et al. .................... 257/697

* cited by examiner

Primary Examiner — Brook Kebede
(74) Attorney, Agent, or Firm — Timothy M. Honeycutt

(57) ABSTRACT

Various methods and apparatus for holding a semiconductor chip package are disclosed. In one aspect, a method of manufacturing is provided that includes forming a first plate adapted to hold a semiconductor chip package. The semiconductor chip package includes a carrier substrate and at least one semiconductor chip coupled to the carrier substrate. A second plate is formed with a first opening defining an interior peripheral surface adapted to compress an outer edge of the carrier substrate between the first plate and the second plate without engaging the at least one semiconductor chip.

26 Claims, 4 Drawing Sheets

SEMICONDUCTOR CHIP PACKAGE FIXTURE

BACKGROUND OF THE INVENTION

1. Field of the Invention

This invention relates generally to semiconductor processing, and more particularly to methods and apparatus for holding semiconductor chip packages during various processing steps.

2. Description of the Related Art

A typical conventional packaged semiconductor chip consists of a laminate of several layers of different materials. From bottom to top, a typical package consists of a base or carrier substrate, a die underfill material, an array of solder joints and the silicon die. For some designs, a thermal interface material and a lid or heat spreader top off the stack. Each of these layers generally has a different coefficient of thermal expansion (CTE). In some cases, the coefficients of thermal expansion for two layers, such as the underfill material and the silicon die, may differ by a factor of ten or more. Materials with differing CTE's strain at different rates during thermal cycling. The differential strain rates tend to produce warping of the package substrate and the silicon die. If the warping is severe enough, several undesirable things can occur. First, the carrier substrate can be warped to a point where some of solder joints delaminate and cause electrical failure. Second, and in the case of lid-type designs, the thermal interface material can be stretched to the point of delamination from either the semiconductor chip, the lid or both. The thermal resistance of the delaminated area can skyrocket resulting in significant heat buildup in that area which can damage the chip.

Conventional multi-chip devices can be susceptible to differential CTE substrate warping. In conventional multi-chip devices, both the substrates and bathtub or "top hat" style lids tend to be oblong. The conventional lids have a continuous internal space that is designed to accommodate two semiconductor chips mounted side-by-side on the substrate. As a result of the large internal space of the lid, the central region of the package substrate is unfettered structurally and may undergo significant thermal strains. The warping can cause delamination of the thermal interface materials of the two dice, particularly near the central region of the substrate.

Solder joint reflow is one process step where substrate warpage can be particularly dangerous. In conventional solder reflow processes, a semiconductor chip is laid on a semiconductor chip package in flip-chip orientation so that the solder bumps of the chip either contact or are in close proximity to a corresponding array of solder bumps on the package substrate and the entire arrangement is placed in a heating device such as a furnace and heated up to be reflow temperature of at least one of the arrays of solder bumps so that metallurgical bonding between the arrays of bumps establishes an array of solder joints. Whatever mismatches in CTE exist at the moment of reflow are exacerbated by the elevated temperatures.

Some manufacturers of certain types of conventional fab tools provide highly specialized types of clamping fixtures that are suitable for holding a semiconductor chip package while in a given tool. For example, Panasonic provides a fixture for holding a semiconductor chip package during a passive components placement process. Datacon provides a fixture for use in a direct placement machine while DEK provides a dedicated fixture for use in a solder printing machine. These conventional machine-specific fixtures provide only a temporary flattening of the otherwise warped package substrate. Once the substrate is removed from the particular machine, the previous warping state will tend to return quickly. If the packet substrate is then subjected to solder reflow the aforementioned solder joint damage or failure can result. Furthermore, the conventional clamping fixtures tend to use vacuum systems in order to provide the requisite clamping force and thus involve a certain level of system and operation complexity.

The present invention is directed to overcoming or reducing the effects of one or more of the foregoing disadvantages.

SUMMARY OF THE INVENTION

In accordance with one aspect of the present invention, a method of manufacturing is provided that includes forming a first plate adapted to hold a semiconductor chip package. The semiconductor chip package includes a carrier substrate and at least one semiconductor chip coupled to the carrier substrate. A second plate is formed with a first opening defining an interior peripheral surface adapted to compress an outer edge of the carrier substrate between the first plate and the second plate without engaging the at least one semiconductor chip.

In accordance with another aspect of the present invention, a method is provided that includes placing a semiconductor chip package that includes a carrier substrate and at least one semiconductor chip coupled to the carrier substrate on a first plate adapted to hold the carrier substrate. A second plate is compressed against the carrier substrate. The second plate has a first opening defining an interior peripheral surface adapted to compress an outer edge of the carrier substrate between the first plate and the second plate without engaging the at least one semiconductor chip.

In accordance with another aspect of the present invention, an apparatus is provided that includes a first plate adapted to hold a semiconductor chip package that includes a carrier substrate and at least one semiconductor chip coupled to the carrier substrate. A second plate has a first opening defining an interior peripheral surface adapted to compress an outer edge of the carrier substrate between the first plate and the second plate without engaging the at least one semiconductor chip.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
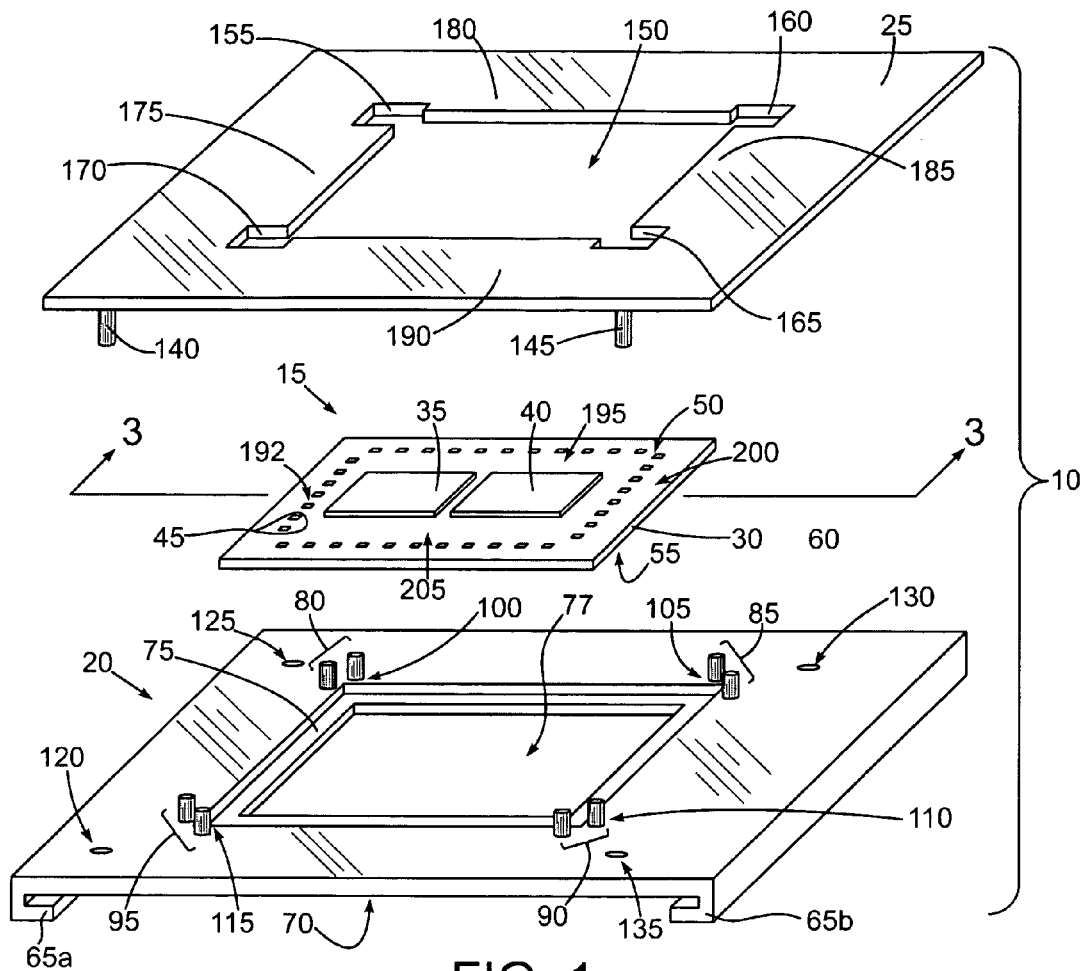
FIG. 1 is an exploded pictorial view of an exemplary embodiment of a fixture that is operable to hold and/or transport and flatten a semiconductor chip package.

In the drawings described below, reference numerals are generally repeated where identical elements appear in more than one figure. Turning now to the drawings, and in particular to FIG. 1, therein is shown an exploded pictorial view of an exemplary embodiment of a fixture 10 that is operable to hold and/or transport and flatten a semiconductor chip package 15. The fixture 10 includes a bottom plate or boat 20 that is designed to receive the semiconductor chip package 15 and a top plate 25 that is designed to engage the bottom plate 20 and compress the semiconductor chip package 15 against the bottom plate 20. For purposes of illustrating the fixture 10, the semiconductor chip package 15 is depicted as a multi-chip module that includes a base or carrier substrate 30 upon which two semiconductor chips 35 and 40 are mounted. The semiconductor chips 35 and 40 may be any of a myriad of different types of circuit devices used in electronics, such as, for example, microprocessors, graphics processors, combined microprocessor/graphics processors, application specific integrated circuits, memory devices or the like, and may be single or multi-core or even stacked with additional dice. Pluralities of solder joints (not visible) electrically connect the semiconductor chips 35 and 40 to the carrier substrate 30.

The carrier substrate 30 may consist of a core/build-up configuration. In this regard, the carrier substrate 30 may consist of a central core upon which one or more build-up layers are formed and below which an additional one or more build-up layers are formed. The core itself may consist of a stack of one or more layers. One example of such an arrangement may be termed a so called "2-4-2" arrangement where a four-layer core laminated between two sets of two build-up layers. The number of layers in the substrate 30 can vary from four to sixteen or more, although less than four may be used. So-called "coreless" designs may be used as well. The layers of the substrate 30 consist of an insulating material, such as various well-known epoxies, interspersed with metal interconnects. Optionally, the substrate 30 may be composed of well-known ceramics or other materials suitable for carrier substrates or printed circuit boards.

A plurality of component devices 45 are shown on an upper surface 50 of the carrier substrate 30. There are other groups of component devices positioned on the underside 55 of the carrier substrate 30 that are not visible in FIG. 1 but will be shown in FIG. 3. The semiconductor chip package 15 need not be a multi-chip module but may take on virtually any configuration that involves one or more semiconductor chips and a carrier substrate like the substrate 30.

The bottom plate or boat 20 includes a substantially flat upper surface 60 that terminates at either side in respective J-hooks 65a and 65b. The J-hook 65 projects downwardly slightly from an under surface 70 of the bottom plate 20. The purpose of the J-hooks 65a and 65b is to elevate the underside 70 somewhat above a supporting surface, such as a conveyor or other surface, when the semiconductor chip package 15 is seated on the bottom plate so that any components on the underside 55 of the semiconductor chip package 15 are not subjected to loads that might cause damage. A recessed shelf 75 is provided in the bottom plate 20 and dimensioned to match the general footprint of the substrate 30 of the semiconductor chip package 15 so that the package 15 may be readily seated on the shelf 75. The shelf 75 thus provides an upward facing bearing surface to support the peripheral portion of the carrier substrate 30. The shelf terminates internally at a rectangular opening 77. Respective pairs 80, 85, 90 and 95 of alignment pegs are provided at the external corners 100, 105, 110 and 115 of the shelf 75. In this illustrative embodiment, the alignment pegs 80, 85, 90 and 95 are optional since the footprint of the shelf 75 will adequately constrain the position of the carrier substrate 30. Four bores 120, 125, 130 and 135 are provided in the upper surface 60 of the bottom plate 20 and are designed to receive alignment pins of the top plate 25, two of which are visible and labeled 140 and 145. The number and positioning of the alignment pins 120, 125, 130 and 135 may be varied from two to some larger number and is largely a matter of design discretion. Exemplary materials for the bottom plate include, for example, stainless steel, carbon steel, aluminum, or the like. The thickness of the bottom plate 20 may be varied. In an exemplary embodiment, the bottom plate 20 may have a thickness of about 0.50 to 15.0 mm.

The top plate 25 is provided with a central opening 150 that includes corner cut outs 155, 160, 165 and 170 that are designed to drop over but externally engage the pairs 80, 85, 90 and 95 of alignment pegs on the bottom plate 20. The central opening 150 allows for compression of the carrier substrate 30 without potentially damaging the semiconductor chip 35 and 40 or the components 45. With the central opening, one or both of the semiconductor chips 35 and 40 could use wire bonds as interconnects if desired. The central opening 150 and the corner cut outs 155, 160, 165 and 170 divide an internal peripheral bearing surface of the top plate 25 into segments 175, 180, 185 and 190 that are designed to compress against portions 192, 195, 200 and 205 of the carrier substrate 30 when the semiconductor chip package 15 is seated on the bottom plate 20 and the top plate 25 is sandwiched against the semiconductor chip package 15. As noted briefly above, the corner cut outs 155, 160, 165 and 170 are optional along with the pairs 80, 85, 90 and 95 of alignment pegs of the bottom plate 20 so long as some sort of alignment arrangement is provided, such as the downwardly projecting alignment pegs 140 and 145 and the two others that are not visible in conjunction with the alignment bores 120, 125, 130 and 135 in the bottom plate 20.

It should be understood that with regard to any of the fixtures disclosed herein, the terms "top plate" and "bottom plate" are somewhat arbitrary since, for example, the fixture 10 could be flipped over and/or the various pins 140, 145 and pairs 80, 85, 90 and 95 could be attached to or formed on either of the plates 20 and 25. The same is true for the magnet arrangements shown in subsequent figures.

Figure 2:
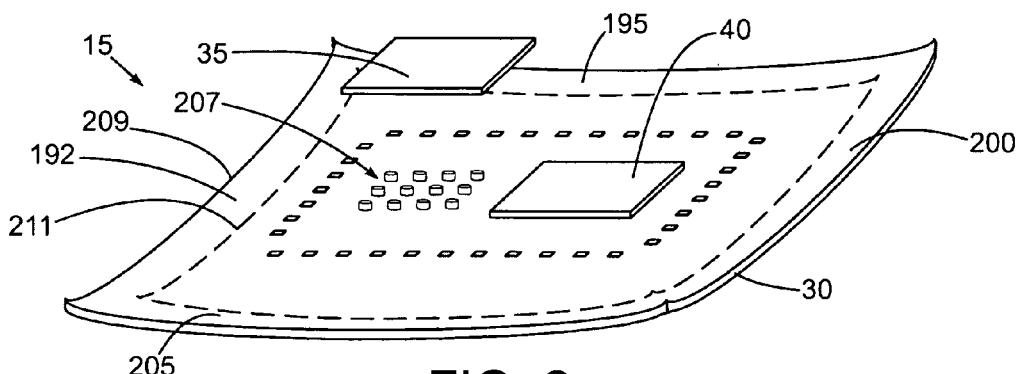
FIG. 2 is a pictorial view of the exemplary semiconductor chip package depicted at greater magnification.

FIG. 2 is a pictorial view of the semiconductor chip package 15 shown at greater magnification to illustrate the warpage problem that the fixtures disclosed herein are designed to alleviate. The semiconductor chip 35 is shown exploded from the carrier substrate 30 to reveal an array 207 of solder joints that are used to electrically connect the semiconductor chip 35 to the carrier substrate 30. A similar but hidden array of solder joints are positioned between the semiconductor chip 40 and the carrier substrate 30. In this illustration, the carrier substrate 30 is depicted with an upward warpage. The warpage is shown somewhat exaggerated for ease of viewing. In actual practice, the warpage may be more subtle and, depending on the structure and composition of the carrier substrate 30 and the semiconductor chips 35 and 40, oriented in an opposite direction to what is shown. Regardless of direction, the warpage of the carrier substrate 30 can place tremendous strains on the array 207 of solder joints, particularly since the individual joints in the array 207 are quite small relative to the size of the carrier substrate 30. The fixtures disclosed herein address the warpage issue by engaging a peripheral area of the carrier substrate 30 defined in FIG. 2 schematically by the area between an edge 209 of the carrier substrate 30 and the dashed rectangle 211 encompasses the aforementioned portions 192, 195, 200 and 205 of the carrier substrate 30. Depending on the weight of the top plate 25 and the stiffness of the carrier substrate 30, at least the edge 209 and perhaps the entirety of the peripheral area is compressed between the top plate 25 and the bottom plate 20 shown in FIG. 1.

Figure 3:
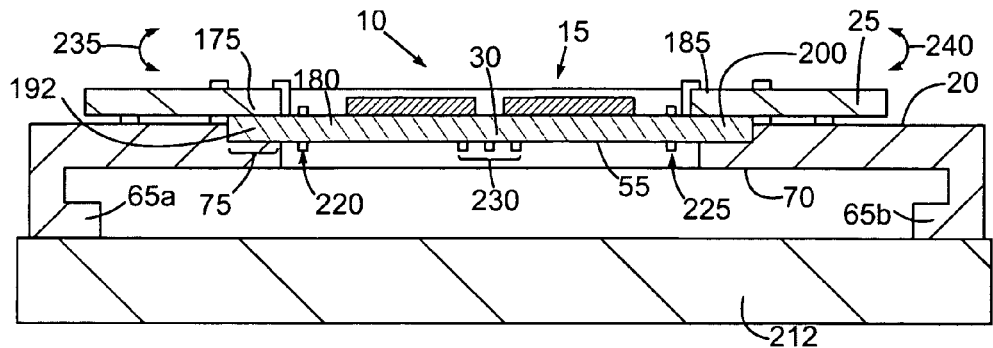
FIG. 3 is a sectional view of FIG. 1 taken at section 3-3.

Attention is now turned to FIG. 3, which is a sectional view of FIG. 1 taken at section 3-3 albeit without the elements shown exploded. The fixture 10 is seated on a transport surface 212, which may be a conveyor belt other type of carrier operable to move the fixture along an axis coming in and out of the page. Note that the J-hooks 65a and 65b elevate the underside 70 of the bottom plate 20 off the transport surface 212 so that various components on the underside 55 of the carrier substrate 30 are subjected to impacts and loads. A few of these underside components of the carrier substrate 30 are shown, namely a row 220 of components and another row 225 of components, as well as a central grouping 230 of components. Indeed, the components positioned on the underside 55 of the carrier substrate 30 may effectively mirror those components 45 shown on the upper side 50 of the substrate 30 in FIG. 1. However, there is also the central grouping of components 230. The components 220, 225 and 230 may be passive components, such as capacitors, inductors, or resistors for modifying signals and power flowing to and from the semiconductor chips 35 and 45. Depending upon the type of interconnect scheme used for the carrier substrate 30, there may also be solder balls, pins or lands positioned on the underside 55 that benefit from being elevated above the transport surface 212.

The carrier substrate 30 is seated in the shelf 75 of the bottom plate 20 as described above. With the top plate 25 engaging the bottom plate 20, the compression segments 175 and 185 compress the portions 192 and 200 of the carrier substrate 30 down against the shelf 75 of the bottom plate 20. The compression segment 180 shown in FIGS. 1 and 3 and the compression segment 190 shown in FIG. 1 perform the same function, albeit against the portions 195 and 205 of the carrier substrate 30. In this illustrative embodiment, the compressive force is provided by the weight of the top plate 25. The compressive force will tend to straighten any warpage, represented graphically by arcs 235 and 240, of the portions 192 and 200 of the substrate 30. Similar flattening will occur for the portions 195 and 205 of the substrate 30. Since weight provides the desired compressive force, the top plate 25 should be constructed from materials that are dense enough to provide adequate compressive force without requiring the top plate 25 to be unwieldy in thickness. Exemplary materials include, for example, stainless steel, carbon steel, aluminum, or the like. The thickness of the top plate 25 may be varied. In an exemplary embodiment, the top plate 25 may have a thickness of about 0.50 to 15.0 mm.

Figure 4:
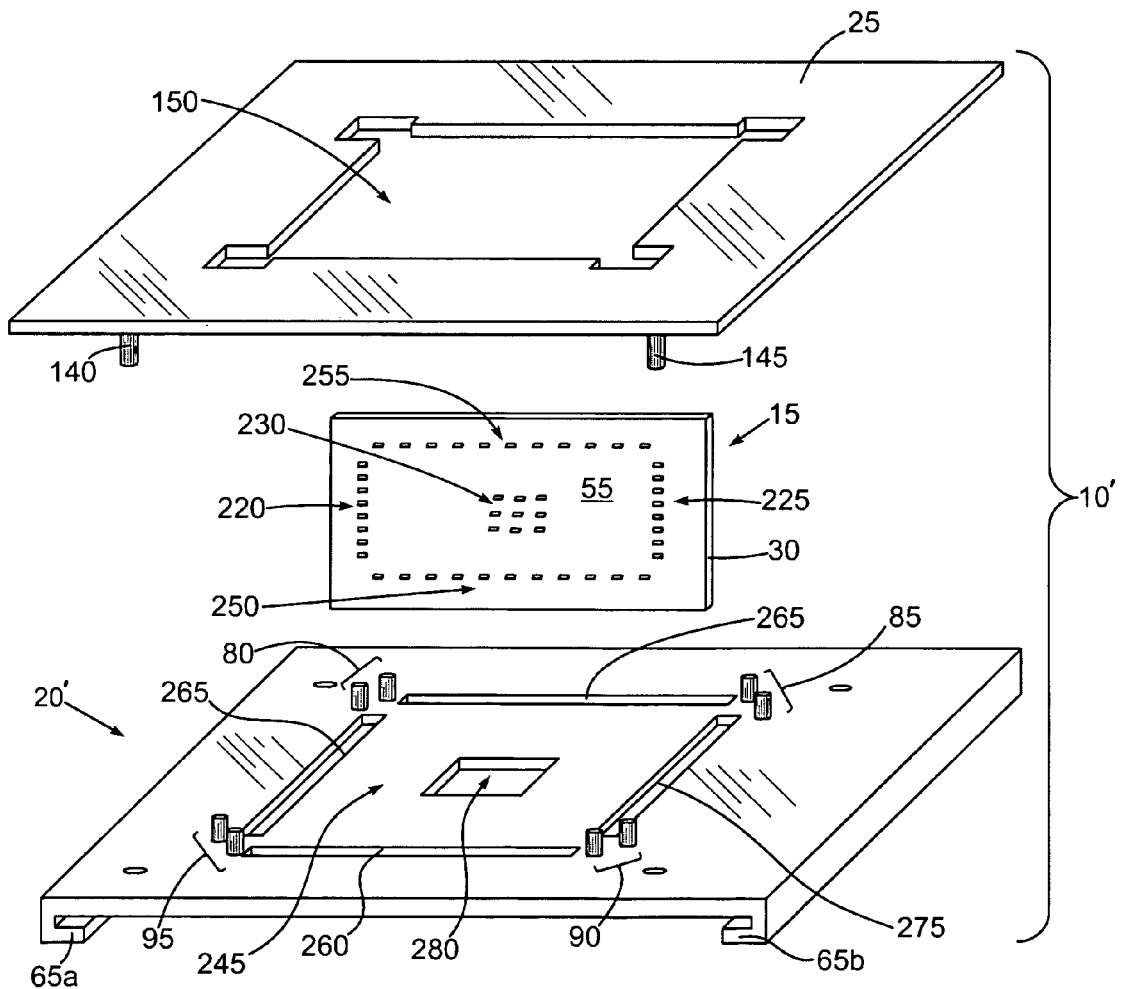
FIG. 4 is an exploded pictorial view of an alternate exemplary embodiment of a fixture that is operable to hold and/or transport and flatten a semiconductor chip package.

An alternate exemplary embodiment of a fixture 10' is shown in an exploded pictorial view in FIG. 4. In this illustrative embodiment, the semiconductor chip package 15 is sandwiched between a bottom plate 20' and the top plate 25. Again, using the weight of the top plate 25 as the provider of a suitable compressive force to reduce any warpage of the carrier substrate 30 of the package 15. The top plate 25 may be configured as generally described above and depicted in FIGS. 1 and 3 and thus include alignment pins 140 and 145, the central opening 150 and J-hooks 65a and 65b. In lieu of the shelf 75 depicted in FIGS. 1 and 3, the bottom plate 20' is provided with a landing area 245 that is designed to have the carrier substrate 30 seat thereon. The carrier substrate 30 is shown flipped over to reveal the groupings 220, 225 and 230 of the components on the underside 55 of the substrate 30 as well as the two other groupings 250 and 255 of components. To accommodate the groupings 220, 225, 230, 250 and 255 of the components, the bottom plate 20' is provided with slots 260, 265, 270 and 275 and a central opening 280. The slots 260, 265, 270 and 275 and the central opening 280 are sized and positioned to allow the groupings to project downwardly there through respectively when the underside 55 of the substrate 30 is seated on the landing area 245. The alignment pegs 80, 85, 90 and 95 function as generally described above.

In another alternate exemplary embodiment, magnetism may be used to provide the desired compressive force to reduce any warpage of a carrier substrate. In this regard, tension is now turned to FIG. 5, which is an exploded pictorial view of a fixture 10" for holding the semiconductor chip package 15. In this alternate embodiment, the semiconductor chip package 15 is sandwiched between a bottom plate 20" and a top plate 25". In addition, a bottom support 285 is designed to sit below the bottom plate 20" with a pedestal 295 projecting up through a central opening 300 in the bottom plate 20". The outer periphery 305 of the carrier substrate 30 is supported not only by the seating surface circumscribed by the dashed rectangle 307 of the top plate 20" but also the pedestal 295. To accommodate the downwardly projecting components of the carrier substrate 30 (not shown in FIG. 5 but depicted in FIG. 4 and numbered 220, 225, 230, 250 and 255), the pedestal 295 may be provided with slots 310, 315, 320 and 325 and a central opening 330 that may be configured similarly to the slots 260, 265, 270 and 275 of the bottom plate 20' depicted in FIG. 4. In this illustrative embodiment, the support plate 285 and the pedestal 295 are integrally formed. Alternatively they may be separately fabricated and later joined by welding, fasteners, adhesives or the like. Both the support plate 285 and the pedestal 295 may be fabricated from metallic materials, such as stainless steel, aluminum, carbon steel, or non-metallic materials, such as plastics.

Figure 5:
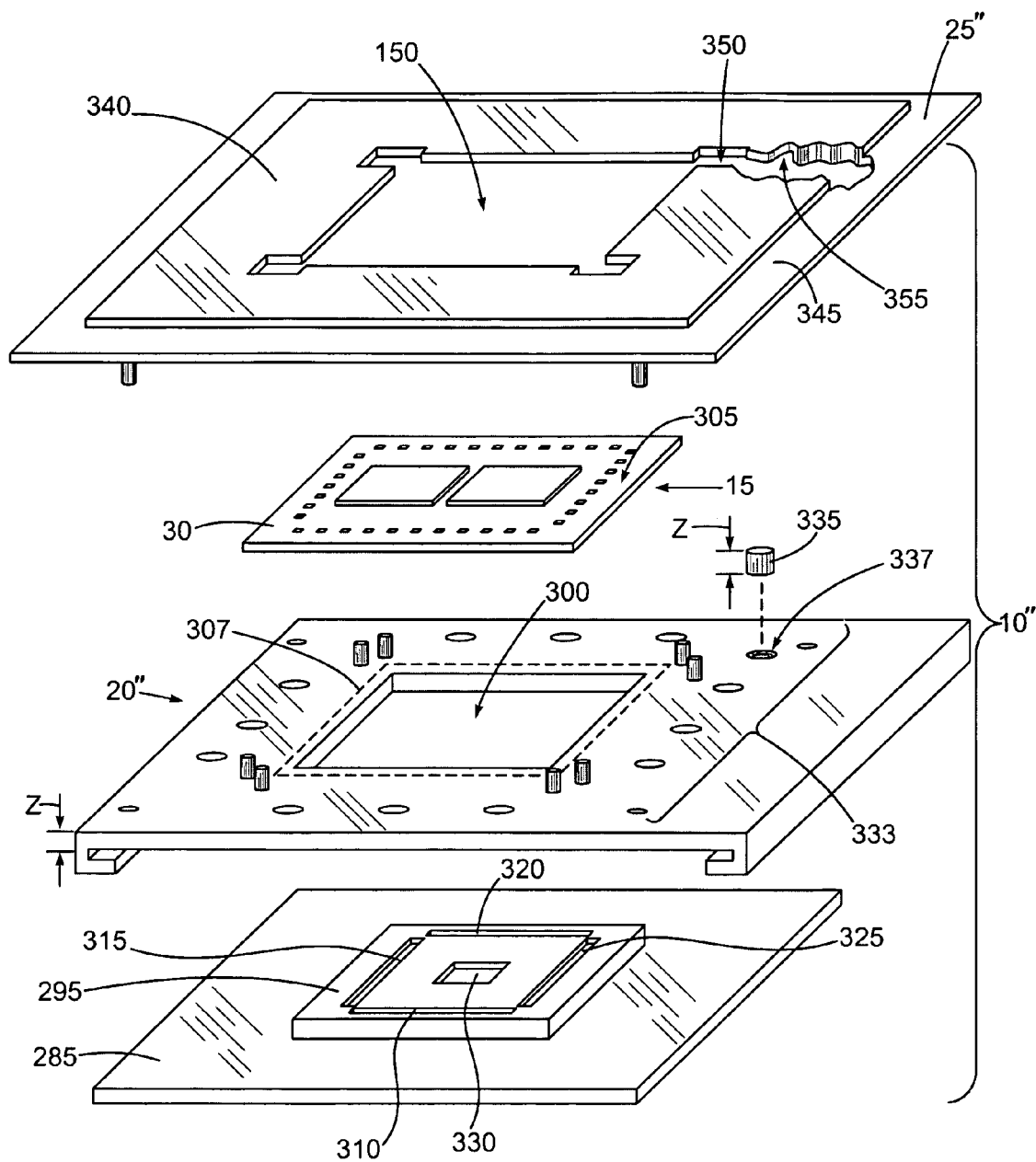
FIG. 5 is an exploded pictorial view of another alternate exemplary embodiment of a fixture that is operable to hold and/or transport and flatten a semiconductor chip package.

Still referring to FIG. 5, a magnet arrangement 333 is associated with the top plate 25" and the bottom plate 20" to attract the two plates 25" and 20" together and compress the carrier substrate 30. In this illustrative embodiment, the bottom plate 20" is provided with a plurality of magnets spaced about the perimeter of the opening 300 that are designed to actively attract the top plate 25" and compress it against the carrier substrate 30 to reduce warpage. One of the magnets 335 is shown exploded from a bore 337 in the bottom plate 20" and illustrative of the other magnets, which are not labeled, but are lodged in respective bores like the magnet 335. The magnet 335 may be fabricated with a height Z that matches the thickness Z of bottom plate 20". In this way, the magnets 335 may also exert magnetic force on the support plate 285 from below and thus actively hold the support plate 285 against the bottom plate 20". To provide for such magnetic action, the support plate 285 or some portion thereof should be manufactured from a ferromagnetic material. The magnets 335 themselves 335 may be round as depicted, or virtually any other shape, and secured to the bottom plate 20" by friction or adhesives. The number and spacing the magnets 335 may be varied. The bottom plate 20" may be composed of the same types of materials described in conjunction with the bottom plates 20 and 20' shown in FIGS. 1, 3 and 4.

The top plate 25" should be at least partially composed of a material or materials responsive to magnetic forces. Ferromagnetic materials, such as carbon or alloy steel, represent two example that will be readily attracted to the magnets 335. The top plate 25" may be provided with the opening 150 that is configured substantially as described above and shown in FIGS. 1, 3 and 4. In lieu of being a strictly planar upper surface, the top plate 25" may have an upper platform 340 that drops down to a shelf 345. A portion of the platform 340 is shown cut away proximate a corner cut out 350 to reveal that the platform 340 may have an underside cavity 355 that is sized to at least accommodate the footprint of the carrier substrate 30 of the semiconductor chip package 15. In this illustrative embodiment, the platform 340 and the shelf 345 are integrally formed. Alternatively they may be separately fabricated and later joined by welding, fasteners, adhesives or the like.

Figure 6:
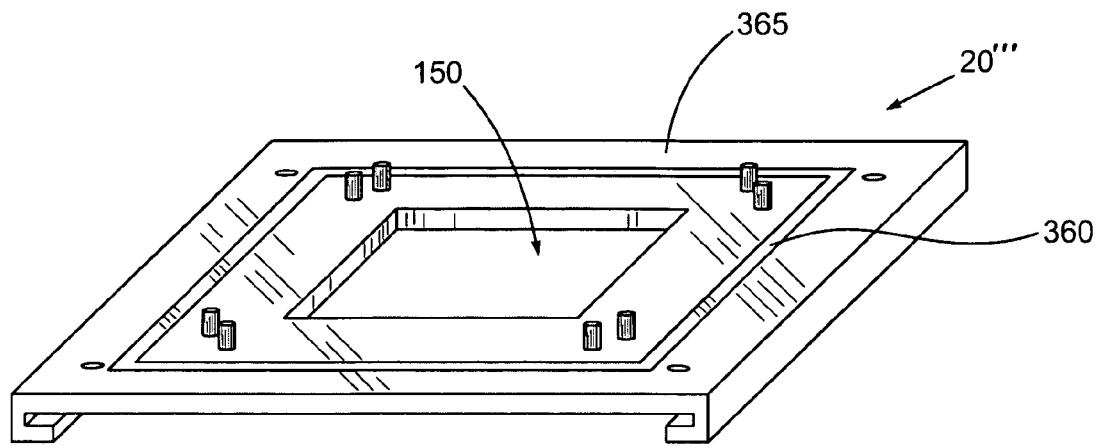
FIG. 6 is a pictorial view of an alternate exemplary embodiment of a component of a fixture that is operable to hold and/or transport and flatten a semiconductor chip package.

In another alternate exemplary embodiment that uses magnetism to provide the requisite compressive force, the magnet arrangement may be fashioned as a frame structure in lieu of a plurality of peripherally spaced individual magnets. In this regard, attention is now turned to FIG. 6, which is a pictorial view of an exemplary embodiment of a bottom plate 20'''. The bottom plate 20''' may be configured like the bottom plate 20" described in conjunction with FIG. 5 with a notable exception. In this regard, the bottom plate 20''' includes a central opening 300 that functions as described above in the embodiment shown in FIG. 5. In lieu of a plurality of peripherally spaced magnets, a magnet frame 360 may be imbedded in or otherwise secured to an upper surface 365 of the bottom plate 20'''. If embedded in the bottom plate 20''', the upper surface 365 may be appropriately machined or otherwise processed in order to establish a trench in the upper surface 365 that has a footprint suitable to receive the frame magnet 360.

Figure 7:
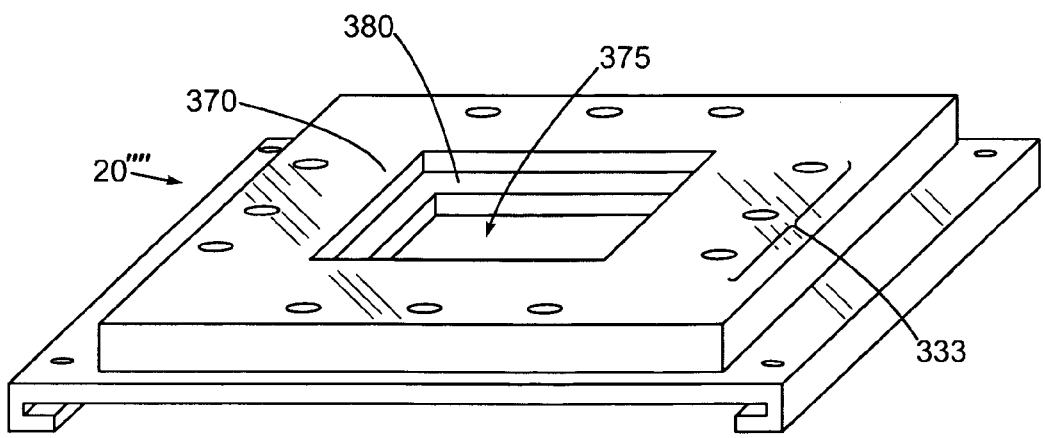
FIG. 7 is a pictorial view of another alternate exemplary embodiment of a component of a fixture that is operable to hold and/or transport and flatten a semiconductor chip package.

Attention is now turned to FIG. 7, which depicts a pictorial view of another alternate exemplary embodiment that uses magnetism to provide the requisite compressive force. In this illustrative embodiment, a bottom plate 20'''' may be provided with a pedestal 370 in which the magnet arrangement 333 is placed. A central opening 375 is formed in the pedestal 370 that is sized to receive, for example, the pedestal 295 of the support plate shown in FIG. 5. A recessed shelf 380 circumscribes the opening 375 and provides a seating surface for a peripheral portion of the semiconductor chip package 15 shown in FIGS. 1, 2 and 3. The recessed shelf 380 functions like the shelf 75 described elsewhere herein. Again, the magnet arrangement 333 may be dimensioned vertically to attract from both above and below and otherwise arranged and shown in FIGS. 5 or 6. In this illustrative embodiment, the bottom plate 20'''' and the pedestal 370 are integrally formed. Alternatively they may be separately fabricated and later joined by welding, fasteners, adhesives or the like.

The embodiments of the fixtures 10, 10', and 10" disclosed herein are operable to hold a single semiconductor chip package 15. However, the skilled artisan will appreciate that any of the fixtures 10, 10' and 10" may be modified to hold multiple semiconductor chip packages simultaneously. For example, and referring to FIG. 1, the top plate 25 may be enlarged and fitted with multiple openings 150 and the bottom plate 20 may be similarly enlarged and fitted with multiple corresponding multiple recessed shelves 75 and the other associated features in FIG. 1 provide for a multiple package fixture.

Any of the embodiments disclosed herein are portable and thus may be used to hold the semiconductor chip package 15 while simultaneously reducing or preventing the warpage of the carrier substrate 30 thereof during various processing steps. For example, and referring to FIG. 3 again, the fixture 10 may be used to hold the semiconductor chip package 15 during transport on the transport surface 212 to a particular location, which may be a furnace, a material deposition chamber, an etch chamber, or virtually any other tool or machine used in semiconductor chip fabrication. Upon delivery to the tool or apparatus in question, the semiconductor chip package 15 may undergo a processing step and then the fixture 10 holding the semiconductor chip package 15 may be moved to another location for another step in the process flow. Particularly for those types of semiconductor chip packages that utilize solder joints for interconnects between chips and carrier substrates, the fixtures 10, 10' and 10" disclosed herein can prevent substrate warpage during thermal cycling which might otherwise weaken or fracture those solder joints.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
   forming a first plate adapted to hold a semiconductor chip package that includes a carrier substrate and at least one semiconductor chip coupled to the carrier substrate; and
   forming a second plate with a first opening defining an interior peripheral surface adapted to compress an outer edge of the carrier substrate between the first plate and the second plate without engaging the at least one semiconductor chip.

2. The method of claim 1, wherein the second plate is adapted to compress the outer edge of the carrier using only the weight of the second plate.

3. The method of claim 1, comprising coupling a magnet arrangement to the first plate or the second plate to attract the first plate and the second plate toward one another and thereby compress the outer edge of the carrier substrate between the first plate and the second plate.

4. The method of claim 1, comprising forming a second opening in the first plate and providing a third plate having a pedestal adapted to project through the second opening and support a portion of the semiconductor chip package.

5. A method, comprising:
   placing a semiconductor chip package that includes a carrier substrate and at least one semiconductor chip coupled to the carrier substrate on a first plate adapted to hold the carrier substrate; and
   compressing a second plate against the carrier substrate, the second plate having a first opening defining an interior peripheral surface adapted to compress an outer edge of the carrier substrate between the first plate and the second plate without engaging the at least one semiconductor chip.

6. The method of claim 5, comprising performing a process step on the semiconductor chip package.

7. The method of claim 6, comprising transporting the semiconductor chip package in the first plate and the second plate from a first location to a second location.

8. The method of claim 5, wherein the second plate is adapted to compress the outer edge of the carrier using only the weight of the second plate.

9. The method of claim 5, comprising coupling at two alignment pins to the first plate or the second plate to enable the first plate to engage the second plate in a preselected orientation.

10. The method of claim 5, comprising coupling a magnet arrangement to the first plate or the second plate to attract the first plate and the second plate toward one another and thereby compress the outer edge of the carrier substrate between the first plate and the second plate.

11. The method of claim 10, wherein the magnet arrangement comprises plural magnets coupled to the first plate.

12. The method of claim 10, wherein the magnet arrangement comprises a magnet having a frame shape coupled to the first plate.

13. The method of claim 5, wherein the first plate has a second opening and a third plate is provided including a pedestal adapted to project through the second opening and support a portion of the semiconductor chip package.

14. The method of claim 5, wherein the carrier substrate comprises a side having plural components and the first plate includes at least one third opening to enable the plural components to project therein.

15. The method of claim 5, wherein the first plate includes a recessed shelf adapted to support the outer edge of the carrier substrate.

16. The method of claim 15, wherein the first plate includes a pedestal and the recessed shelf is positioned in the pedestal.

17. An apparatus, comprising:
a first plate adapted to hold a semiconductor chip package that includes a carrier substrate and at least one semiconductor chip coupled to the carrier substrate; and
a second plate having a first opening defining an interior peripheral surface adapted to compress an outer edge of the carrier substrate between the first plate and the second plate without engaging the at least one semiconductor chip.

18. The apparatus of claim 17, wherein the second plate is adapted to compress the outer edge of the carrier using only the weight of the second plate.

19. The apparatus of claim 17, comprising at least two alignment pins associated with the first plate and the second plate to enable the first plate to engage the second plate in a preselected orientation.

20. The apparatus of claim 17, comprising a magnet arrangement associated with the first plate and the second plate to force the first plate and the second plate toward one another and thereby compress the outer edge of the carrier substrate between the first plate and the second plate.

21. The apparatus of claim 20, wherein the magnet arrangement comprises plural magnets coupled to the first plate.

22. The apparatus of claim 20, wherein the magnet arrangement comprises a magnet having a frame shape coupled to the first plate.

23. The apparatus of claim 17, comprising a third plate having a pedestal, the first plate having a second opening adapted to receive the pedestal.

24. The apparatus of claim 17, wherein the carrier substrate comprises a side having plural components, the first plate having at least one third opening to enable the plural components to project therein.

25. The apparatus of claim 17, wherein the first plate comprises a recessed shelf adapted to support the outer edge of the carrier substrate.

26. The apparatus of claim 25, wherein the first plate comprises a pedestal, the recessed shelf being positioned in the pedestal.

* * * * *